United States Patent
Jaiswal

(10) Patent No.: US 10,838,123 B2
(45) Date of Patent: Nov. 17, 2020

(54) MATERIALS, COMPONENTS, AND METHODS FOR USE WITH EXTREME ULTRAVIOLET RADIATION IN LITHOGRAPHY AND OTHER APPLICATIONS

(71) Applicant: Supriya Jaiswal, San Diego, CA (US)

(72) Inventor: Supriya Jaiswal, San Diego, CA (US)

( * ) Notice: Subject to any disclaimer, the term of this patent is extended or adjusted under 35 U.S.C. 154(b) by 0 days.

(21) Appl. No.: 14/952,879

(22) Filed: Nov. 25, 2015

(65) Prior Publication Data

US 2016/0085003 A1    Mar. 24, 2016

Related U.S. Application Data

(63) Continuation-in-part of application No. 13/745,618, filed on Jan. 18, 2013, now Pat. No. 9,322,964.

(Continued)

(51) Int. Cl.
*G06K 7/10* (2006.01)
*G02B 5/20* (2006.01)
(Continued)

(52) U.S. Cl.
CPC .............. *G02B 5/208* (2013.01); *C23C 16/06* (2013.01); *C23C 16/45553* (2013.01);
(Continued)

(58) Field of Classification Search
CPC .......... G02B 1/005; G02B 1/10; G02B 5/008; G02B 5/08; G02B 5/0816; G02B 5/085–0875; G02B 5/0891; G02B 5/10; G02B 5/18; G02B 5/1809; G02B 5/1838; G02B 5/1842; G02B 5/1847; G02B 5/1857; G02B 5/1861; G02B 5/1866; G02B 5/3058; G02B 5/3075; G02B 13/143; G02B 13/22; G02B 13/24; G02B 13/26; G02B 17/0647–0663; G02B 27/4222;

(Continued)

(56) References Cited

U.S. PATENT DOCUMENTS 5,458,084 A * 10/1995 Thorne .................. B82Y 10/00
117/108
7,807,318 B2 * 10/2010 Park ....................... B82Y 10/00
430/311

(Continued)

OTHER PUBLICATIONS

International Search Report and Written Opinion in PCT/US2015/062803 dated Mar. 11, 2016 in 11 pages.

(Continued)

*Primary Examiner* — Arnel C Lavarias

(57) ABSTRACT

Nanostructured photonic materials, and associated components for use in devices and systems operating at ultraviolet (UV), extreme ultraviolet (EUV), and/or soft Xray wavelengths are described. Such a material may be fabricated with nanoscale features tailored for a selected wavelength range, such as at particular UV, EUV, or soft Xray wavelengths or wavelength ranges. Such a material may be used to make components such as mirrors, lenses or other optics, panels, lightsources, masks, photoresists, or other components for use in applications such as lithography, wafer patterning, astronomical and space applications, biomedical applications, biotech or other applications.

26 Claims, 8 Drawing Sheets

Related U.S. Application Data

(60) Provisional application No. 62/085,222, filed on Nov. 26, 2014, provisional application No. 61/588,601, filed on Jan. 19, 2012.

(51) Int. Cl.

| | |
|---|---|
| *H01J 37/28* | (2006.01) |
| *C23C 16/455* | (2006.01) |
| *C23C 16/06* | (2006.01) |
| *G02B 5/08* | (2006.01) |
| *G03F 7/20* | (2006.01) |
| *G03F 1/24* | (2012.01) |
| *G21K 1/06* | (2006.01) |
| *G03F 1/52* | (2012.01) |
| *G02B 1/00* | (2006.01) |

(52) U.S. Cl.
CPC ........... *G02B 5/085* (2013.01); *G02B 5/0891* (2013.01); *G03F 1/24* (2013.01); *G03F 1/52* (2013.01); *G03F 7/70316* (2013.01); *G03F 7/70958* (2013.01); *G21K 1/062* (2013.01); *H01J 37/28* (2013.01); *G02B 1/005* (2013.01)

(58) Field of Classification Search
CPC ........ G02B 1/00; G02B 1/002; G02B 5/0808; G02B 5/0858; G02B 5/0866; G02B 5/0875; G02B 2005/1804; G02B 5/1814; G02B 2207/101; G02B 2207/107; G02B 2207/114; G03F 7/70; G03F 7/7015–70166; G03F 7/702; G03F 7/70233; G03F 7/70316; G03F 7/70958; G21K 1/06; G21K 1/062; G21K 1/067; G21K 2201/06; G21K 2201/061; G21K 2201/064; G21K 2201/067; G21K 2201/00; C23C 16/06–20; C23C 16/45525–45555; G01M 11/005; G01M 11/0278

USPC ....... 359/350, 359, 360, 361, 577, 580, 582, 359/584, 585, 586, 588, 589, 590, 838, 359/839, 883, 884; 355/67, 71; 977/700, 977/712, 720, 721, 722, 723, 832, 834, 977/902, 932; 216/24; 427/162, 163.1, 427/163.4, 164, 165

See application file for complete search history.

(56) References Cited

U.S. PATENT DOCUMENTS

| | | | |
|---|---|---|---|
| 9,640,291 B2 * | 5/2017 | Feser | G21K 1/00 |
| 10,403,504 B2 * | 9/2019 | Longrie | H01L 21/76879 |
| 2003/0232256 A1 * | 12/2003 | Wurm | B82Y 10/00 |
| | | | 430/5 |
| 2004/0051954 A1 | 3/2004 | Bristol | |
| 2005/0012975 A1 | 1/2005 | George | |
| 2005/0275818 A1 | 12/2005 | Singer | |
| 2007/0054196 A1 | 3/2007 | Lee | |
| 2008/0062397 A1 * | 3/2008 | Nam | B82Y 10/00 |
| | | | 355/66 |
| 2008/0113303 A1 * | 5/2008 | Silverman | B82Y 10/00 |
| | | | 430/322 |
| 2010/0027106 A1 | 2/2010 | Weiser | |
| 2011/0164237 A1 * | 7/2011 | Soer | B82Y 10/00 |
| | | | 355/71 |
| 2013/0126728 A1 | 5/2013 | Waiblinger | |
| 2013/0156939 A1 | 6/2013 | Budach | |
| 2013/0202866 A1 * | 8/2013 | Lee | C03C 17/007 |
| | | | 428/216 |

OTHER PUBLICATIONS

International Search Report and Written Opinion in PCT/US2013/022297 dated Mar. 29, 2013 in 13 pages.

* cited by examiner

Figure 1 Reflectance profile of theoretical Mo-Si multilayered structure compared to new material reflectivity.

MATERIALS, COMPONENTS, AND METHODS FOR USE WITH EXTREME ULTRAVIOLET RADIATION IN LITHOGRAPHY AND OTHER APPLICATIONS

This application is a continuation in part of U.S. patent application Ser. No. 13/745,618, filed Jan. 18, 2013, entitled "Materials, Components, and Methods for Use with Extreme Ultraviolet Radiation in Lithography and Other Applications," which is incorporated herein by reference, and is a non-provisional of U.S. Provisional Application No. 61/588,601, filed Jan. 19, 2012, titled "Materials, Components, and Methods for Use with Extreme Ultraviolet Radiation in Lithography & Other Applications," the disclosure of which is hereby incorporated by reference in its entirety. This application also claims priority to U.S. provisional patent application No. 62/085,222, filed Nov. 26, 2014, which is incorporated herein in its entirety.

BACKGROUND

Over the past 50 years, the technological pace of advancement has been driven by the manufacture of integrated circuit chips. The complexity and density of integrated circuits has grown exponentially to achieve higher computing performance and power over several generations. Integrated circuits back in the 1960s might have located up to 500 transistors on a single integrated circuit chip, but now have several billion in the same physical area. Accordingly, the structures that must be built on these integrated circuit chips must be smaller and smaller in every subsequent generation.

This process of advancing to smaller feature sizes is called the die shrink. Indeed this die shrink has been a consistent feature in enabling the production or new and more efficient computer processors, memories, and other devices. For example, semiconductor manufacturing processes were operating at 1000 nm widths in about 1985, and by now are able to operate at a width of 22 nm. Even now, technology is moving towards even significantly smaller devices in the sub 14 nm range. In this way, ever increasing numbers of transistors can be squeezed into the same physical integrated circuit size.

Optical lithography systems are commonly used for fabrication of integrated circuits, transistors and nanotechnology, as the first step in semiconductor manufacturing process. In photolithography, a physical mask is prepared that represents a pattern to be formed on a tiny circuit substrate, usually a silicon wafer. Light is used to transfer the pattern from the mask on to the substrate. Even a relatively simple integrated circuit chip may have 50 or more layers, with each layer a pattern transferred with a different photomask. A seamier tool is typically used in the photolithography process to deliver the focused light onto the wafer. The light must sufficiently well focused using optical elements to pattern features at small enough length scale to achieve the desired physical resolution. The resolving power of such systems is proportional to the exposure wavelength of the lightsource. Thus, shorter wavelengths can improve resolution in fabrication needed to achieve sub 20 nm feature sizes.

Deep ultraviolet lithography (DUVL) uses electromagnetic radiation at deep ultraviolet (DUV) wavelengths (approximately 250 nanometers to 120 nanometers). A set of transmissive optical lenses and a transmission photomask in the scanner tool is responsible for managing the light and focusing down to the desired resolution and transferring the pattern on to the wafer. Extreme ultraviolet lithography (EUVL) uses electromagnetic radiation at extreme ultraviolet (EUV) wavelengths (approximately 120 nanometers to 0.1 nanometers). Accordingly, photons at these wavelengths have energies in the range of approximately 10 electron volts (eV) to 12.4 keV (corresponding to 124 nm and 0.1 nm, respectively). Extreme ultraviolet wavelengths may be generated artificially by devices such as plasma and synchrotron light sources. Using EUV wavelengths for lithography has potential advantages of reducing feature sizes to less than 20 nm in devices such as semiconductor chips as well as in other applications such as polymer electronics, solar cells, biotech, medical technologies, imaging technologies. At EUV wavelengths, the materials used to form the components of the lithography system, for example mirrors, lenses, photoresist, etc. become important. EUV scanner systems rely on a set of reflective mirrors and reflective photomasks to transfer the IC chip pattern into the substrate at the desired resolution.

An EUV scanner tool may contain up to 12 or more mirrors or interfaces to manage and focus the light. Each interface reflects a proportion of light and absorbs or scatters the rest. With a set of 12 or more mirrors, less than 1% of the available light energy is actually transferred through the system to the wafer, and the other 99% is either absorbed or scattered. To compensate for these dramatic levels of absorption and scattering, the BUY lightsource must be incredibly powerful. But the manufacture and imitation of such high power lightsource is highly undesirable. High power EUV light sources are expensive to build, and have high electricity consumption. Further, with substantially over 99% of the available energy being absorbed in the scanner, the optical components are susceptible to thermal damage and limited lifetime.

Most materials tend to absorb EUV radiation, consequently there are limited selection of materials available for optical elements used in photolithography systems. Typically an EUV reflective mirror uses a fused silica substrate covered with a Molybdenum Silicon multilayer coating formed by magnetron sputtering. This Mo—Si coating typically achieves approximately 67% reflectivity, with over 30% of the light being primarily absorbed, and also scattered. The fabrication of the multilayer is highly challenging and often theoretically predicted reflectivity values (72%) are not achieved in practice. This limitation on reflectivity at each optical interface is primarily responsible for the poor overall energy efficiency of the scanner tool, and the light delivered to the wafer.

SUMMARY OF THE INVENTION

This disclosure relates generally to materials, devices, apparatus, and methods for use with ultraviolet (UV), extreme ultraviolet (EUV) and soft Xray radiation, such as in lithography (EUVL) or other applications. More specifically, but not exclusively, the disclosure relates to materials and components for use in UV, DUV, EUV and soft Xray applications, as well as methods of fabrication and use of such materials and components in apparatus, devices, and systems using EUV radiation.

This disclosure relates to systems or sub-systems, instruments, tools and apparatus that may be either UV, DUV, EUV and soft X-rays including material processing systems, lasers and light sources, imaging, scanning, illuminating or sensing systems, editing or writing systems, monitoring, observation, inspection or detection systems, high resolution systems e.g. telescopes, satellites, biotech or genetic applications.

In general this disclosure relates to optical elements used independently or inside systems or subsystems that may use either UV, DUV, EUV and soft X-rays.

The element can be a substrate, mirror, lens, surface, window, facet, filter, covering element, capping layer, protective layer, barrier layer, thin film, coating, internal surface area, collector, droplet generator, interdispersed material, panel, waveguide, cavity, fiber, structural component, reflective element, transmissive element, a detector, a camera, a wavelength monitor, bandwidth or power monitor, sensors, a photomask, photoresist, a cooling mechanism, a pellicule, a heat management mechanism, light source, lamp, laser, optical element, mask aligner, integrator, structural component, optical device, electrical device.

In certain embodiments, the disclosure relates to an element that can be used in a light exposure system, wherein the system or subsystem includes a light source to transmit light having a wavelength. The element can include a material having plurality of structural features. The plurality of structural features can improve the reflectivity of the element to greater than 70% for a selected wavelength.

In another embodiment, the disclosure relates to an element that can be used in a light exposure system. The system or subsystem can include a light source to transmit light having a wavelength. The element can include a material having plurality of structural features. The plurality of structural features can improve the transmission of the element to greater than 4% for a selected wavelength.

In another embodiment, the disclosure relates to an element that can be used in a light exposure system. The system or subsystem can include a light source to transmit light having a wavelength. The element can include a material having plurality of structural features. The plurality of structural features can control, increase or decrease the electromagnetic radiation absorption for a selected wavelength.

The optical element has a plurality of integrally formed nanostructures or nanoscale features configured to interact with electromagnetic radiation operating at predefined wavelengths, with the predefined wavelengths in some cases being shorter than visible light. The size of nanostructures can be on the order of the predefined wavelength or sub-wavelength, or multiples of the predefined wavelength. The structures are configured to substantially increase the reflectivity or transmission of the optical element, or increase or decrease the absorption of the optical element at that wavelength beyond that of its bulk counterpart. These nanostructures may be arranged in specific patterns or configurations, or shapes or voids to achieve a desired optical performance at a pre-defined frequency. The exact material configuration can be designed by electromagnetic simulations, and then fabricated accordingly. Further, processes to design, fabricate and characterize the optical element are disclosed. Selection of base materials, configuration structures and assembly techniques are further disclosed.

The material configuration may also be fabricated using a building block process. In the building block process, the material or a subset of the material may be assembled or stacked to create an overall bulk material structure. For example, but not limited to, a metal, dielectric, semiconductor or polymer 3D array may be stacked in any configuration to form a 3D bulk material object where the overall bulk material reveals a stacked structure of multiple units of the original material.

In one embodiment, the wavelength is less than or equal to 250 nm. The plurality of structural features can have a first size where the first size substantially correlating with the wavelength. In one embodiment, the plurality of structural features, including building blocks, nanostructures have a first size of between 250 nm and 0.01 nm. The plurality of structural features can be one, two, or three dimensional. The plurality of structural features can have a periodicity in the material. The periodicity may be in one, two, or three dimensions. The plurality of structural features can be arranged in one of the following: semi-periodic, aperiodic, quasi-periodic, graded, partially graded, symmetric, fractal, gyroid, swiss roll, non-planar, segments, repeated unit, forming a pattern, or randomly or semi random order in the material. The plurality of structural features can have shapes or dimensions containing layers, films, spheres, blocks, pyramids, rings, porous structures, cylinders, linked shapes, shells, freeform shapes, chiral structures, non-descript shapes, hemispheres or segments.

The material selection can include one or more of the following: metal, dielectric, gas, liquid, alloy, compound, semiconductor, polymer, organic material, biological material, monatomic material, monolayer, aerogel, air, Carbon, Molybdenum, Beryllium, Lanthanum, Boron Carbide, Silicon, $SiO_2$, $TiO_2$, Ruthenium, Niobium, Rhodium, Gold, Silver, Copper, Platinum, Palladium, Germanium, Technetium, Strontium, Zirconium, DNA, proteins, Cucubituril, conducting oxide, gel, sol gel, metal organic framework, graphene, silicene, germene, cellulose, micelles, graphite, carbon nanotubes, MoS, MoSe, $O_2$, $N_2$, He, $H_2$, Ar, $CO_2$, one dimensional material or two dimensional material. The structural features, or nanoscale building blocks, can include one or more of the following: metal, dielectric, gas, liquid, compound, semiconductor, polymer, organic material, biological material, monatomic material, monolayer, aerogel, air, Carbon, Molybdenum, Beryllium, Lanthanum, Boron Carbide, Silicon, $SiO_2$, $TiO_2$, Ruthenium, Niobium, Rhodium, Gold, Silver, Copper, Platinum, Palladium, Germanium, Technetium, Strontium, Zirconium, DNA, proteins, Cucubituril conducting oxide, gel, graphene, gyroid, plasmene, silicene, germene, micelles, metal organic framework, molecular sieve, membranes, filters, graphite, carbon nanotubes, or MoS, $O_2$, $N_2$, He, $H_2$, Ar, $CO_2$, vacuum or voids.

In one embodiment, the material or subset of the material or aspect of the material can be fabricated by one of the following methods of processing: self-assembly, directed assembly, soft templating, electroforming, electroplating, sacrificial or scaffolding materials, block co-polymers, bottom-up techniques, EUV or XUV lithography, focused electron or ion beams, nanoimprinting, atomic force or scanning probe microscopy, two or more photon lithography, laser irradiation, dealloying, chemical etching, chemical surfactants, surface treatments and atomic layer deposition.

The material configuration may also be fabricated using a scaffolding structure where the scaffolding structure may support or host a building block assembly. In a specific example, the element is made by first providing a scaffolding structure, and then depositing a material in or around the scaffold. The scaffolding structure provides the basic template for nanostructures and in some cases forms at least part of the nanostructure, and in other cases the scaffold is sacrificial such that upon its removal the voids become at least part of the nanostructure.

The base materials in the optical element may be deposited by atomic layer deposition. Atomic layer deposition is a self-limiting process which produces exceptionally high quality films of good stoichiometry, high purity, bulk density, 3D conformality, low defectivity and low surface roughness. Atomic layer deposition can be used to deposit sacrificial materials, provide alternative substrates, or materials in and around scaffolding structure or during building block assembly.

During design, simulation, and fabrication the optical element must be characterized or inspected to ensure that it achieves a desired level of optical performance, e.g. reflectivity, transmission or absorption, or surface roughness prior to use in an application. Characterization is a challenging process and must be done concurrently with fabrication, and integral to achieving performance at EUV wavelengths. Characterization set-ups include Scanning Electron Microscopes, Reflectometers, Spectrophotometers, Spectrometry, Optical absorption, Atomic Force Microscopy, Scanning Probe Microscopy, X-ray diffraction, EUV lightsources, EUV synchrotron, Transmission Electron Microscopy.

In certain embodiments, the disclosure provides a method of fabricating a material that can have a reflectivity of more than 70% at a wavelength. The method can include the step of polishing a host layer. In some embodiments, the method can further include the step of assembling a polymeric or scaffolding structure. Moreover, the method can include growing a main layer over the scaffolding structure. The grown layer may also be deposited by atomic layer deposition. The method can also include polishing the surface of the main layer. Furthermore, the method can include the step of removing the polymeric or scaffolding structure so that the reflectivity of the material is greater than 70% at a wavelength between 0.1 nm and 250 nm. In some embodiments, the method can include the step of smoothing one or more layers through laser irradiation or chemical etching, or other cleaning. The polymeric or scaffolding structure can be one or more block co-polymers. In one embodiment, the method can further include the step of applying a capping layer on top, or substrate on the bottom.

In some embodiments, the material or structural features can be cleaned, smoothed or post processed by one of the following methods of processing: chemical etching, laser radiation or heating, annealing, ion etching, atomic layer etching, or vapor annealing.

BRIEF DESCRIPTION OF THE DRAWINGS

The present disclosure may be more fully appreciated in connection with the following detailed description taken in conjunction with the accompanying drawings, wherein.

DETAILED DESCRIPTION OF PREFERRED EMBODIMENTS

Figure 1:
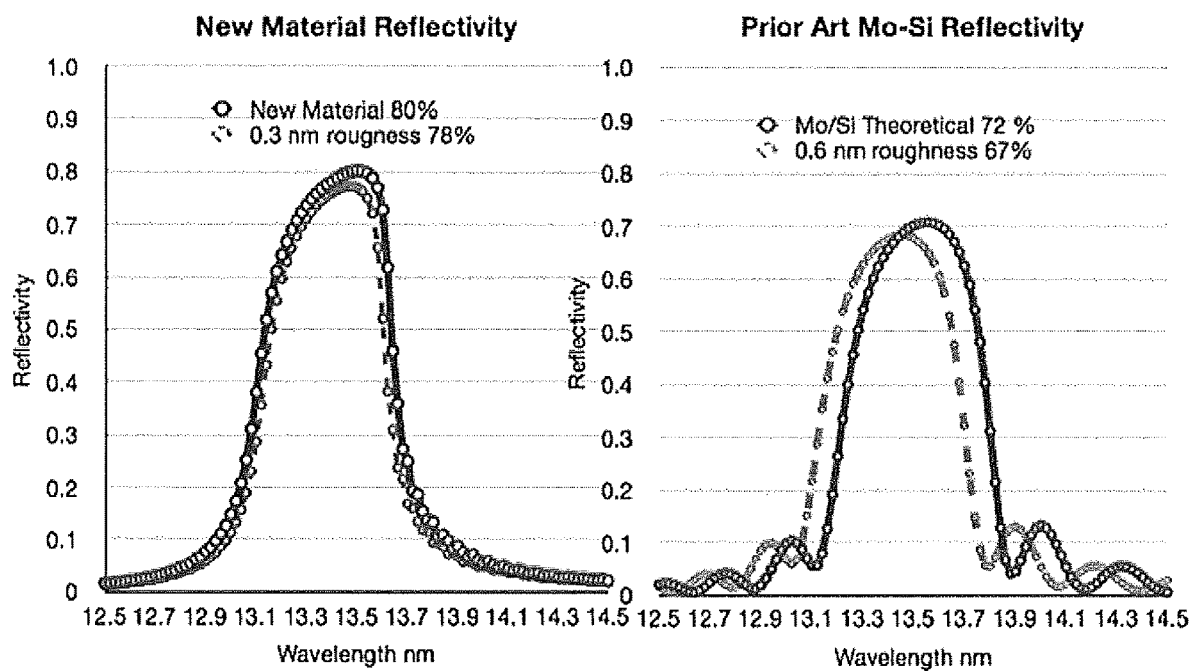
FIG. 1 illustrates details of reflectivity characteristics of a Mo/Si multilayer stack at EUV wavelengths compared to a structure of a material described herein. The figure also shows the effect of surface roughness on the reflectivity.

Lithography using extreme ultraviolet (EUV) radiation may enable fabrication of devices with smaller feature sizes. However, most materials have a high absorption for electromagnetic radiation in the EUV spectrum. The choice of natural materials with a low absorption rate in the EUV spectrum is limited. Accordingly, the high absorption of most materials affects the performance of EUV lithography (EUVL) systems. For example, high levels of optical power might be required to operate a EUVL system. The system might also require an extensive heat management system because of the increased optical power.

This disclosure describes materials or material configurations that can improve performance of EUVL systems. The disclosure further describes fabrication of these materials and using these materials in components, apparatus, and devices of a EUVL system. The materials, methods, and systems described here can also be used in systems where the electromagnetic radiation is in the ultraviolet and the soft x-ray wavelengths.

The materials can further improve performance in non-lithography systems which may use UV, EUV, or soft X-ray wavelengths. For example, lamps and light sources, biological (e.g. biological assay and array development), botanical systems, imaging and microscopy systems, sensor activation, fluorescence, quantum dots, astronomy systems, material processing systems and atomic, nuclear and particle emission radiation, acceleration systems, space systems.

As used herein, UV radiation is electromagnetic radiation in the wavelength range of approximately 400 nanometers to 120 nanometers, EUV radiation is electromagnetic radiation in the wavelength range of approximately 120 nanometers to 1 nanometer, and soft X-ray radiation is electromagnetic radiation in the wavelength range of approximately 1 nanometer to 0.01 nanometers. The selected wavelength range may be part of a two or more photon process which may be equivalent to an excitation in the UV, EUV or X-ray range. Some differences in definition may exist in the general literature, but the intended region is approximately the same. In addition, the intended range intends to encompass radiation defined as XUV radiation. In semiconductor lithography systems the wavelength of interest is 13.5 nm.

This disclosure also describes systems, apparatus, and methods, which employ UV, EUV, XUV, soft X-ray radiation for applications in biomaterial development, printing and patterning, microscopy, material processing, astronomical systems, light exposure, imaging and scanning systems, illumination, sensing, editing or writing systems like laser direct write, monitoring, observation, inspection or detection systems, high resolution systems e.g. telescopes, satellites, biotech or genetic applications. More specifically, the applications can include 3D printing, selective biomaterial patterning, biosensor activation, DNA/peptide patterning, sequencing, quantum dot activation, fluorescence microscopy, selective biomaterial activation.

Modern EUV scanners or lithography systems need highly reflective mirrors to increase the light delivered to the wafer. For a system containing up to 12 or more mirrors, a significant amount of light is lost due to limited reflectivity mirrors. The entire scanner system has an overall efficiency of less than 1%. The prior state of the art mirrors are made from a coating of Molybdenum Silicon multilayers that theoretically have a reflectance of 72% at 13.5 nm but in practice is reduced to 67% when fabricated. The fabrication process introduces at least 0.6 nm surface roughness between the interface of the layers, which causes light to be scattered. The graph 100 of FIG. 1 shows the simulated efficiency of a top-performing prior art reflective mirrors, which is formed from Mo—Si, inclusive of scattering. In sharp contrast, the new material and structures, disclosed herein provides a theoretical reflectivity at 80%. At first consideration, a simple 10% increase in reflectivity may not seem dramatic, but consider the use of multiple reflective mirrors in a photolithography scanner. In such a case, the state of the art theoretical mirror would deliver 0.3% of the energy input into the scanner to the wafer. In contrast, the mirrors disclosed herein would pass over 1%. With current EUV optical sources this new optical element enables the use of relatively low power optical sources even with much shorter wavelengths. In this way, the significant power consumption, manufacturing cost, engineering challenges and heat problems associated with moving to shorter EUV wavelengths is avoided.

The disclosure describes new materials that can be used in extreme ultraviolet wavelength applications. The new material may include features that can be used in applications that require operation at one or more electromagnetic wavelength range. In one embodiment, the dimension of structural features is approximately in the same order as the wavelengths used in extreme ultraviolet applications. For example, the structural features can have a dimension of approximately 13.5 nm. In some embodiments, the features may be structural features having dimensions in the order of 10 to 20 nm. In another embodiment, the material can have structural features in the range of 0.001 nm to 10 nm. In yet another embodiment, the material can have structural features in the range of 10 nm to 250 nm. These features can be referred to as nanoscale features.

Nanoscale structural features are typically configured into a material to change its optical properties, and overall configuration on a mesoscale. Depending on the design, type, shape and distribution of the nanoscale structure chosen different optical properties can be attributed to the new material. For example, a 3D array of spheres, or 2D layer of holes or voids within a substrate, where the overall material configuration is the array and the nanostructural features are either the spheres, or other shaped elements, or the voids. Typically a collection of these nanostructural features, rather than a single feature, form the overall material configuration. For example, the configuration might be carefully selected and positioned to enhance the reflectivity at a selected wavelength, or reduce the optical absorption at a selected wavelength or improve the overall transmission to be greater than that of the bulk material without the nanoscale features. The disclosure herein describes different kinds of configurations to achieve the desired effect, and then methods of fabrication to make the desired structure. Typically a simulation is used to understand the required pre-defined arrangement at a select wavelength needed to achieve the desired optical performance.

The new materials can contain nanoscale features designed to reduce or increase absorption from their bulk counterpart in applications that use ultraviolet (UV) wavelength range or soft X-Ray range.

The new materials can contain nanoscale features designed to extraordinarily increase optical transmission of light through a surface plasmon effect, or reduced optical absorption. This is useful to produce highly transparent materials as may be needed for a pellicule or a lens.

In one embodiment the dimension of the structural features can correlate to the UV wavelengths. In other embodiments, the dimensions of the structural features can correlate to the soft X-Ray wavelength range. For example, in some applications, the nanoscale features can approximately correlate with the wavelength of the radiation used in that application. The material may include sub-wavelength features, i.e. features smaller than the wavelength of light or the material may contain feature sizes which are integral multiples of the wavelength of light.

The nanoscale features may include, for example, a periodic or semi-periodic, quasi-periodic or aperiodic structure, random or a repeating or repeated element. The periodic structure may be a one, two or three dimensional structure. The structure may be part of a layered structure, or on a substrate. The substrate may be planar or non-planar or freeform. Examples of a periodic structure include a 2D or 3D array of nanoparticles, a gyroidal structure, a swiss-roll structure.

The nanoscale features may be one dimensional, two dimensional, or three dimensional. The nanoscale features can be of any shape in any dimension, for example, but not limited to, layers, films, spheres, blocks, pyramids, rings, porous structures, cylinders, linked shapes, shells, freeform shapes, chiral structures, hemispheres, segments or any combination thereof.

The material may include, for example, a graded structure. For example a layered structure in any dimension where some layers within the material have lengths, depths, thicknesses, periods or repeating units, that increase or decrease from the previous layer. In one embodiment if the layers are arranged in such a way to produce a graded refractive index, then a customized optical response is produced for a broader range of wavelengths or angles. The structure may be part of a layered structure, or on a substrate. The substrate may be planar or non-planar or freeform.

The material may include porous materials. For example, a porous metallic structure, porous metal foam, or a porous nanoparticle, where the porosity or the 3D confinement reduces the optical absorption. The nanoparticle may for example be SiO2, with a coating of metal. The porous materials may also have various filling fractions, the ratio between the pore size and its wall thickness, to control optical properties like angular range.

In some embodiments it is beneficial to decrease or increase the bulk density of the base material used to further enhance the optical performance in UV wavelength range. The deposition methods described herein may be used to increase the bulk density of the based material. The nanoscale structures may be used to decrease the bulk density of the material.

The additional of nanostructural features also provides a localized change in refractive index and a localized optical interface where light may be reflected, transmitted, absorbed or scattered. A plurality of interfaces can be collectively used to enhance reflection, transmission, absorption or coherent scattering.

Figure 2:
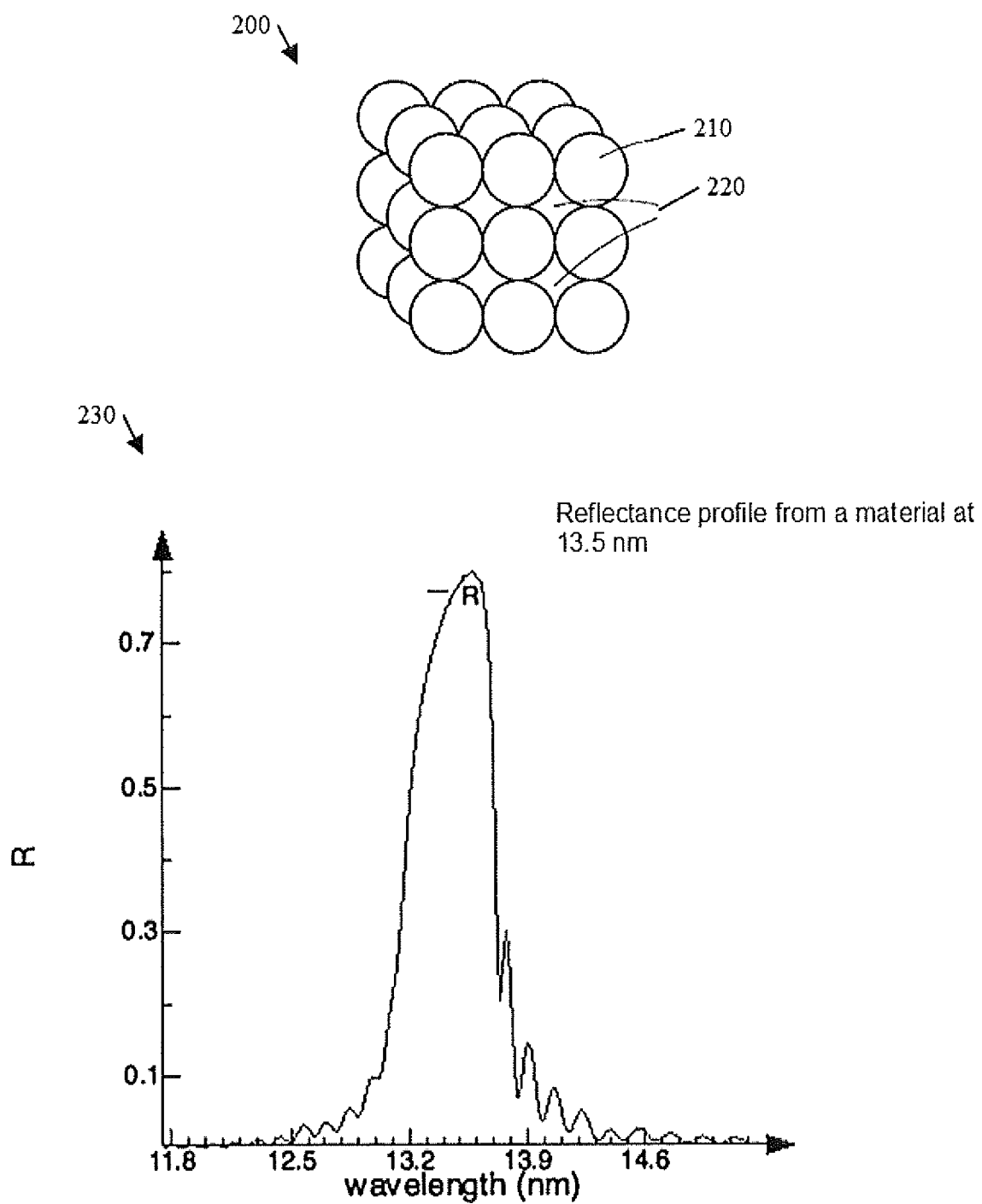
FIG. 2 illustrates an embodiment of a three dimensional structure containing structural features and an example reflectance profile from a structure at EUV wavelengths.

FIG. 2 illustrates an embodiment of 3D array 200 with voids 220. The material 210 may include gaps or voids 220 of any shape. The gaps or voids 220 may be distributed throughout the material 210 in any dimension and can have sizes ranging from 0.01 nm to micron sizes. The gaps or voids 220 may be filled with a fluid, a liquid gas, monatomic material, organic material, polymer or vacuum. The material may include membranes, free standing structures or elements, or partially supported structures or features, or supporting structure. The features may be supported by structures or components. The gaps may be periodic or random in distribution. The gas may include O2, H2, He, N2, Ar, CO2 or other gases including non-inert gases. An example is a 3D periodic array (e.g. 200) of metallic spheres (e.g. 210) with air gaps (e.g. 220). If the system is under vacuum, then the voids may also include vacuum. FIG. 2 also illustrates a reflectance profile 230 from a material that may include voids. As shown in FIG. 2, the reflectance 230 is more than 70% at wavelength of approximately 13.5 nm.

The material may further include micro or nanostructural features of the monatomic material or monolayer. Some examples of the monatomic and monolayer material include graphene, graphite, molybdenum sulphide, molybdenum selenide, silicene, germene, and carbon nanotubes. The monatomic material may serve as an optical element or a heat management or cooling mechanism element. The monatomic material may be used in combination with other materials e.g. a metal, dielectric, semiconductor. It may form part of a layered structure, periodic structure, multidimensional or freeform structure, or be on a substrate.

The material may be an organic material or a biomaterial. The material may further comprise micro or nano structural features of the organic or bio material. Examples of organic materials or biomaterials, include DNA, proteins, or other molecular or genomic material which have lower absorption in the wavelengths. The organic material or biomaterial may also be a sacrificial material, or a soft templating or scaffolding structure. The organic or bio material may be encapsulated in other material, which include, but not exclusively, polymers or dielectrics or semiconductors. The organic or bio material may serve as an optical element or a heat management or cooling mechanism element. The organic or bio material may be used in combination with other materials e.g. a metal, dielectric, semiconductor. It may form part of a layered structure, periodic structure, multidimensional or freeform structure, or be on a substrate.

The material can also include a polymer. The material may further comprise micro or nano structural features of the polymer. The polymer may also be a sacrificial material, or a soft templating or scaffolding structure. In some embodiment, the polymer may be removed, leaving gaps or voids in the material. These gaps or voids may form structural features in the material. In other embodiments, the polymer can remain in the material. The polymer may be photoresist. The polymer may also be irradiated and exposed by a laser or a two or more photon laser process.

The material may include nanoscale features that are made using metals, semiconductors, alloys, dielectrics, compounds, gases, liquids or combinations of these. These nanoscale structures can be engineered to reduce absorption by the material at one or more band of wavelengths. The metal may include for example gold, silver, platinum, molybdenum, beryllium, ruthenium, rhodium, niobium, palladium, copper, lanthanum, Rhodium, Gold, Silver, Copper, Platinum, Palladium, Germanium, Technetium, Strontium, or Zirconium. The combined material may include for example silicon, silicon dioxide, boron carbide, carbon, organic, biomaterial, germanium, polymers or monatomic materials or monolayers or voids, liquids or gases or other element, alloy or compound, or vacuum. In this case, either material can have a small amount of absorption as described by the imaginary part of the refractive index, where one material has more than the other.

The material may have nano-sized structures and features which form an array or are periodic in one, two or three dimensions, for example, but not limited to, a photonic crystal, plasmonic crystal, metamaterial, chiralic structure or sub-wavelength structure. Features of the array may be tuned to optimize the wavelength, spectral bandwidth, photonic bandgap angular acceptance, reflectance including average reflectance (when averaged over the spectral range), transmission, absorption, scattering and electromagnetic enhancement factor, resonance or interaction modes. The structure may provide a cavity which slows the group velocity of light to increase electromagnetic interaction, or form a waveguide or cavity where certain electromagnetic nodes are enhanced and certain nodes are forbidden. In the case of forbidden modes of propagation, this may be used to form a selective or omnidirectional mirror with tunable peak wavelength and spectral bandwidth properties. The cavity can also be used to enhance the conversion of light from infrared to EUV, as may be needed in a two or more photon process, or a lightsource emitting EUV radiation from infrared excitation e.g. a plasma source. The material may also be designed to slow down or speed up the group velocity thereby increasing or decreasing respectively the absorption of light in the material.

The nanoscale features of the material may, for example, be configured as a 3D hexagonally packed array. The 3D hexagonally packed array may include a metal. The metal may be, for example, gold, silver, ruthenium, molybdenum, silicon, germanium, or platinum, palladium or other metal. See FIG. 2, for example.

The nanoscale features of the material may, for example, include a gyroid structure. The gyroid structure can be a metal, for example, gold, silver, ruthenium, molybdenum, silicon, germanium, or platinum.

The nanoscale features of the material may, for example, be made using graphene or molybdenum and graphene (Mo-Graphene). The nanoscale features may include a graphene double gyroid structure.

The material may be located on a substrate. The substrate may be silicon or fused silica, quartz, glass, low thermal expansion substrate or other substrate e.g zerodur. The substrate or films deposited on the substrate may have an underlying seed layer. For example, if a metal film is deposited as part of multilayer structure, or on a scaffold structure then an underlying seed layer of SiO2, TaO5, sapphire, soda lime glass, or other metal, dielectric, element or compound, may be deposited first to help the adhesion and film quality of the metal or multilayer film. The seed layer may either be on the substrate or within the material embodiment.

This disclosure further describes methods, apparatus and techniques used to fabricate the material. The EUV materials can be fabricated using top down fabrication procedures, where materials are deposited onto a flat substrate via electrodeposition in a controlled vacuum environment. The deposited material can have a thickness of approximately 5 nm or less and a roughness factor less than lambda/20. A low roughness factor may be preferred due to the Mie scattering from anomalies which reduce the overall reflectance or transmission of the material. Depositing ultraflat materials with sufficiently low roughness can be challenging. When multiple materials or a layered structure is used, each material and layer can be individually smoothed or polished.

In some embodiments, the EUV material can be fabricated using a bottom up approach. In the bottom up fabrication approach, the bulk material can be gradually grown by inserting matter from the bottom end of the structure, thereby only requiring one surface (the topmost outer layer) for smoothing. The bottom up approach can be used to fabricate lithography based materials for use in the UV, EUV and soft X-ray ranges of wavelengths.

Figure 6:
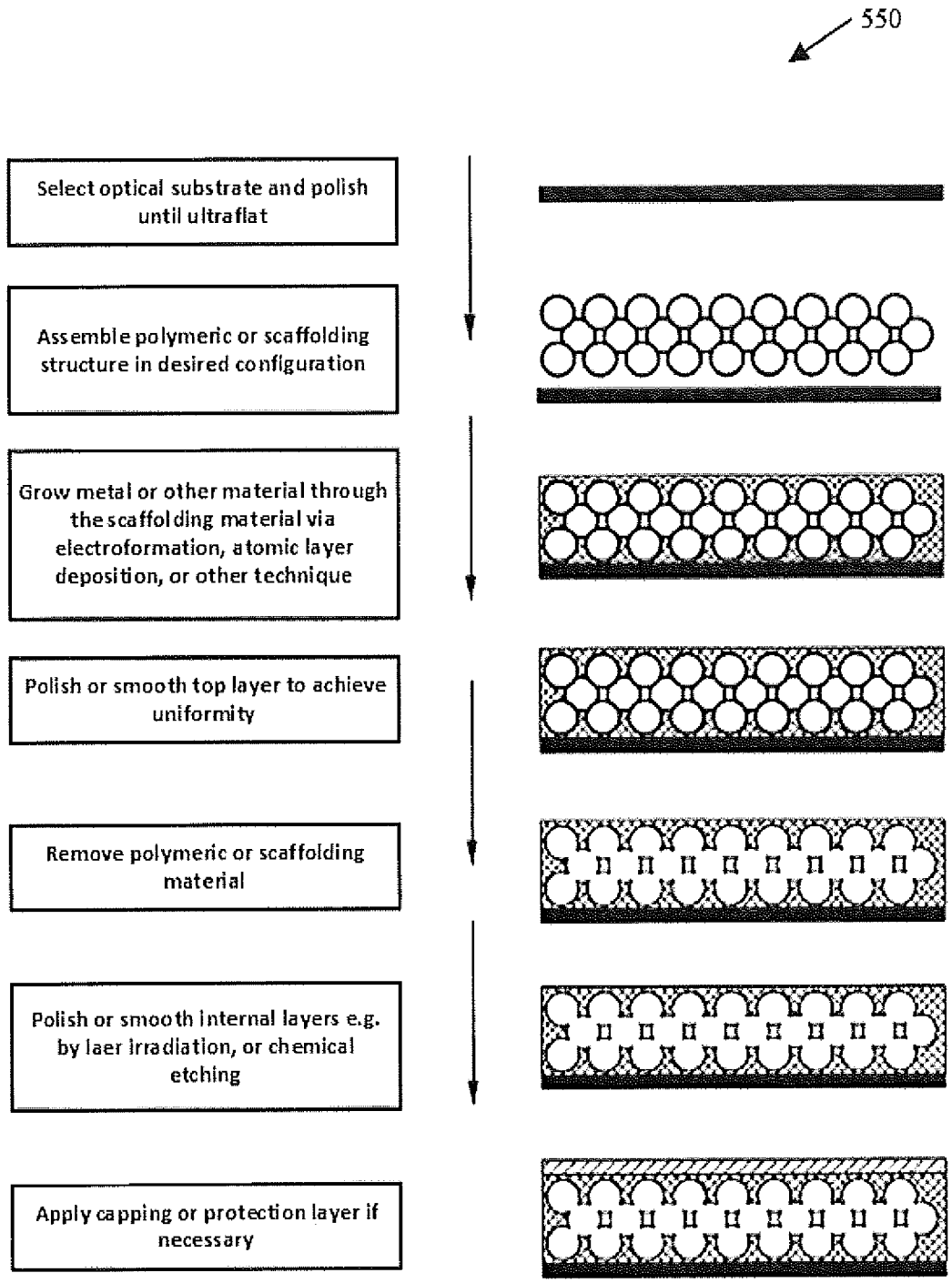
FIG. 6 shows an embodiment of a fabrication process to make a material described herein using a polymeric template.

In one embodiment, the material optimized for a particular wavelength can be fabricated using a soft templating approach. In the soft templating approach, certain polymers or sacrificial or temporary materials, but not exclusively, may be temporarily used in conjunction with electrodeposition and other material deposition techniques. The sacrificial materials or polymers form a soft template, or scaffolding structure, which may later be removed once the actual material is in place. The sacrificial or temporary material may be removed by chemical etching or other methods. An example of a sacrificial material may be photoresist. Another example of a temporary material is a nanosphere. The soft templating approach can be used to fabricate lithography based materials optimized to reduce absorption for one or more of the wavelengths or range of wavelengths in the UV, EUV and the soft X-ray range. These EUV materials can be further used to manufacture elements for lithography systems. FIG. 6 illustrates an embodiment of a method for fabrication materials described herein using a polymer based soft templating approach. The method 550 can include the step of polishing a host layer. In some embodiments, the method can further include the step of assembling a polymeric or scaffolding structure. Moreover, the method can include growing a main layer over the scaffolding structure. The method can also include polishing the surface of the main layer. Furthermore, the method can include the step of removing the polymeric or scaffolding structure so that the reflectivity of the material is greater than 70% at a wavelength between 0.1 nm and 250 nm. In some embodiments, the method can include the step of smoothing one or more layers through laser irradiation or chemical etching. The polymeric or scaffolding structure can be one or more block co-polymers. In one embodiment, the method can further include the step of applying a capping or substrate.

In another embodiment of a soft templating approach a polymeric material or block co-polymer or micelle, or metal organic framework, or molecular sieve, or biological material, or organic material, or membrane may be spin coated onto a substrate. The structure is ultimately built through subsequent processing steps involving one or more of heating, annealing, chemical rinsing or deposition. The deposition technique may include a wide angle deposition, or a variable angle deposition or sputtering, electroformation, solvent deposition, solvent vapour anneal, ultrasonic pyrolysis, or atomic layer deposition. The soft templating approach may be used to produce large area EUV materials.

The EUV material can also be fabricated using an electroformation or other similar process. In electroformation a material, e.g. a metal, is grown through another material by chemical, electrical or magnetic means. This method can be used in the electroformation of the metal molybdenum and ruthenium, which are not commonly electroformed metals. The electroforming process can be used in the fabrication of lithography based materials at UV, EUV and soft X-ray range.

It has been found that it is highly desirable to have the EUV materials be fabricated using atomic layer deposition. The category of atomic layer deposition may include specific processes such as atomic layer deposition, atomic layer epitaxy, atomic layer deposition, chemical vapor deposition including plasma enhanced chemical vapor deposition, low pressure chemical vapor deposition, metal organic chemical vapor deposition, or epitaxy. Atomic layer deposition is a self-limiting process which produces exceptionally high quality films of good stoichiometry, high purity, bulk density, 3D conformality, low defectivity and low surface roughness. Atomic layer deposition can be used to deposit sacrificial materials, provide alternative substrates, or materials in and around scaffolding structure or during building block assembly.

Figure 7:
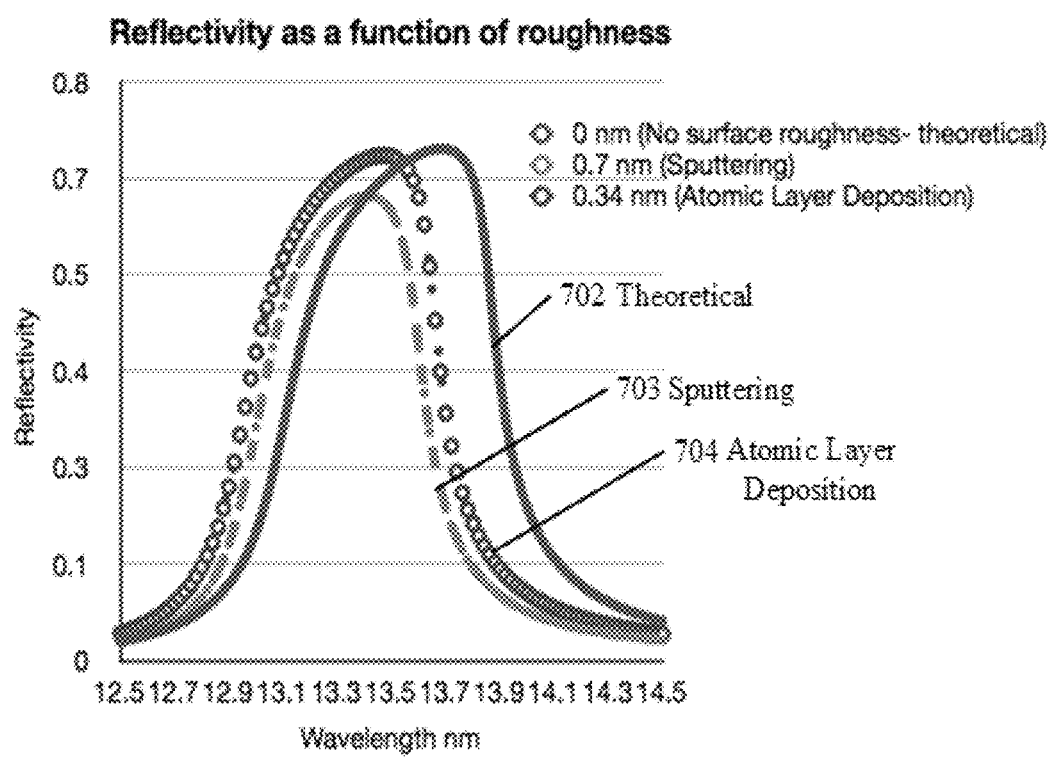
FIG. 7 shows reflectivity profiles of a EUV mirrors using atomic layer deposition.

Atomic layer deposition of materials with low surface and interfacial roughness and high conformality in EUV materials is highly desirable to increase efficiency and reflectivity. FIG. 7 shows the improvement in EUV reflectivity 700 via materials fabricated via atomic layer deposition. Specifically, FIG. 7 charts the theoretical reflectivity 702, and the reflectivity for sputtering 703 and atomic layer deposition 704 process.

Figure 6A:
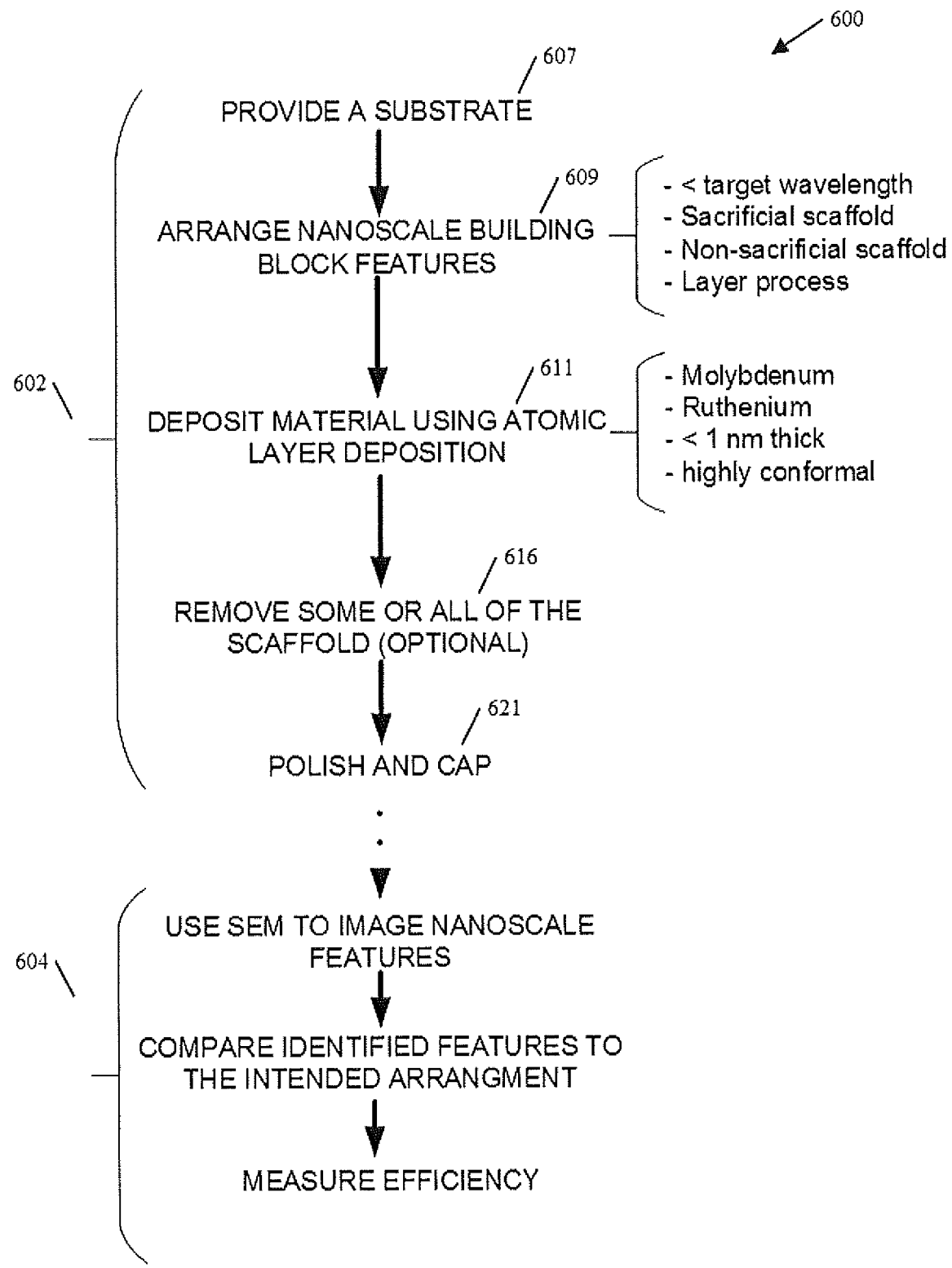
FIG. 6A is a process to make an optical element in accordance with the present invention.

Referring now to FIG. 6A, a process 600 for using an atomic layer deposition process is illustrated. In particular, process 600 is directed to manufacturing and characterizing an optical element for use at EUV wavelengths, and more broadly in any wavelengths from about 0.1 nm to about 250 nm. Generally, process 600 shows the process of manufacturing 602 the optical element, as well as characterizing 604 that optical element and material. As illustrated in block 607, a substrate is provided on which a predefined nanoscale structure is to be arranged 609. In some cases, the nanoscale structures may include a scaffold as previously described. The scaffold in some cases may become part of the final material configuration, and in other cases may be sacrificial such that it is removed during the manufacturing process. As the nanostructures are arranged, material will be deposited using an atomic layer deposition process 611. The particular material may be any of those previously described, however Molybdenum and Ruthenium have been found to be particularly useful. The use of atomic layer deposition 611 enables a highly uniform thickness of material to be applied at less than 3 nm thick. Further, the layer application has a high degree of conformality, such that the resulting topology of the layer is highly indicative of the nanostructure.

Optionally, in the case of a sacrificial scaffold, the scaffold may be removed 616. In such a case, voids may remain that in some cases may become part of the element's material configuration as previously described. In other cases, the scaffolding, if used, may remain and also may become part of the material configuration. Finally, the optical element is polished and capped 621 as previously described.

Two materials have shown particular promise in achieving high reflectivity at EUV wavelengths. Ruthenium and more significantly Molybdenum, have both proven to be particularly effective as base materials in EUV optical elements. However, prior to the use described herein, these two elements have not been successfully deposited using atomic layer deposition in a way that provides the improved roughness and conformality necessary for EUV reflectivity. But, as described below, with the use of particularly developed precursors, such conformality and improved roughness characteristics have been achieved.

The development process may involve the novel use of one or more particular precursors. The precursor may be solid, liquid or vapor. The precursor may also be metal, or metal organic or purely organic. The deposition may involve a seeding process and a purge process to remove contamination. The atomic layer deposition may use a boost process in which a gas is used to bubble a precursor. The tool may use a plasma in the process of deposition. Additionally, the deposition may involve the use of ambient gases. The gases may include N2, O2, NH3, H2. The reaction may be self-limiting. Examples of materials that may be deposited by atomic layer deposition on to or as part of an optical element may include, but not limited, metals, Ruthenium, Molybdenum, Strontium, Zirconium, Molybdenum Oxide, SiO2, Silicon, Tantalum, Titanium and their compounds. Unique precursors for the deposition of Mo include but are not limited to MoCO6, MoCl5 and MoCl6, MoO3, MoCl4, MoO2 C22H22Mo2O6, C16H10Mo2O6, C10H10C12Mo, C10H10Cl2Mo, MoF6, Si2H6. Unique precursors for Ru deposition include C10H10Ru, C7H9RuC7H9, Ru(C5 (CH3)5)2, Ru3(CO)12. T Additionally the use of an organic precursor may be used in combination with any of the above listed precursors to create true atomic layer deposition. Examples of organic precursors include dihydroprazine.

EUV, DUV, Soft Xray or Optical materials containing at least one element fabricated by atomic layer deposition may be used in hybrid combinations with other materials or in one or more dimensional or hierarchical structures. For example a multilayer mirror may contain all or some of the top layers fabricated by atomic layer deposition. The roughness of the atomic layer deposition component may be less than 1 nm. Additionally, unlike other deposition methods the surface roughness of the atomic layer deposition may be less than 0.5 nm. Using atomic layer deposition an extremely high level of conformality may be achieved with aspect ratios 1:1 or greater. The underlying structure may be single or multidimensional, solid or porous, and can be conformally coated by atomic layer deposition.

The preparation of the material may involve a cleaning step either before or after the deposition. If the material is prepared on a substrate, then the substrate may require a cleaning step before or after the deposition. The cleaning step could involve the use of acids or bases. The material or substrate may be prepared using a silanization step.

The material configurations may also be fabricated by a bubble nucleation process, or an organic vaporization process to achieve greater than 70% reflectivity. The material may involve base elements or compounds or alloys that have been altered from their stoichiometric form, or may be an isotope. In some cases the bulk density of the material may be changed to tailor the optical properties. The material may be formed from a single bulk or collection of materials which are dielectric in form to produce an all dielectric mirror. The materials or their substrate may also be fabricated in a multi-dimensional additive manufacturing set-up using machining equipment with one or more degrees of freedom.

The EUV materials can be further fabricated using a self-assembly or other similar process. In self-assembly, certain aspects of the material, e.g. nanoscale features are assembled together to form the overall bulk structure. The assembly formation may either be self-assembly or a directed assembly. In one embodiment, the features may retain a given rigid structure through chemical or electrical or magnetic means. An example of this is a chemically polarized material. In another embodiment, the substrate of the material may be pre-patterned to ensure a preferential structure or embodiment of the bulk material disposed on top of it. In another embodiment, the substrate may be surface treated with an organic or biomaterial or chemically treated to ensure a preferential or selective structure or embodiment of the bulk material disposed on top of it. The self-assembly approach can be used to fabricate lithography based materials for use in the UV, EUV, and soft X-ray ranges of wavelengths.

The material can also be fabricated using a folding process. In the folding process the material or a subset of the material may be folded, or bent or hinged, to add a higher dimension to the overall material structure. For example, but not limited to, a metallo-dielectric 2D array may be folded to form 3D hierarchical object where the overall bulk material reveals a stacked structure of multiple units of the original material.

The material may also be fabricated using a building block process. In the building block process, the material or a subset of the material may be assembled or stacked to create an overall bulk material structure. For example, but not limited to, a metal semiconductor, 3D array may be stacked in any configuration to form a 3D bulk material object where the overall bulk material reveals a stacked structure of multiple units of the original material.

The material may for example be fabricated by a chemical etching process. Chemical etchants (e.g. acids) may also be used to selectively remove material in semiconductors or polymers or metals In some embodiments, the material may be fabricated using dealloying process. In this method, the material may include a metal. The metal may be mixed with another auxiliary metal e.g. via a heating/melting process to form an ingot. An acid which may be corrosive can be used to then selectively remove the auxiliary metal e.g. gold or silver, to leave a porous structure of the original material. The remaining structure may form a uniform and smooth surface at the atomic level.

The EUV material or any subset or element of the material can be further polished or smoothed using a laser. The laser may have a pulse duration in the femtosecond or picosecond range. The laser may be used prior, during or after the fabrication. The laser may also be used to irradiate the material post fabrication to efface, remove, clean or dislodge any defects, anomalies or non-uniformities. This includes removal of defects which are not directly involved in the fabrication process. For example in embodiment of the material on a photomask. The photomask while in may receive a defect particle from another part of its fabrication process, or a defect particle from a stray ion/element in the lithography or lightsource system. The photomask can subsequently be cleaned by a laser irradiation process.

In some embodiments, a nanoscale structural feature or building block or element of the material may further be manufactured by laser. The laser may be used prior during or after the fabrication. The laser approach may be part of a two or more photon process approach.

The material or any subset or element of the material may further be polished or smoothed using a chemical etchant with a controlled concentration. In one embodiment, the material or any subset or element of the material can be further smoothed using a surfactant, or chemically treated surface, during the formation of the material. The surfactant may be removed later. The chemical surfactant approach can be used to fabricate photonic structure formations for use in the UV, EUV and the soft Xray range.

The material or any subset or element of the material may further be polished or smoothed using plasma etchant or ion etching, electron etching, or in a scanning electron microscope, or using atomic layer etching. In one embodiment the material may be post polished by radiation, ion or molecular bombardment in omni-directional etching or be polished by an inductively coupled plasma (ICP) etch tool.

The material or any subset or element of the material, or nanoscale feature may also be manufactured by a lithography or printing or patterning process. The lithography or printing process may include for example, e-beam lithography, nano-imprint lithography, UV, EUV or X-ray lithography, 2D or 3D lithography, stereolithography, focused electron or ion beams, scanning tunneling microscopy, scanning probe lithography, atomic force microscopy, sol-gel nanofabrication, two or more photon lithography, dip pen lithography, near field lithography, laser assisted imprinting, temperature based patterning, laser based patterning, laser direct write processes. In addition, an etching or deposition or temperature process may be used in combination with the lithography or printing process. The lithography or printing approach can be used to fabricate lithography based materials at UV, EUV and soft X-ray range and used in lithography devices, systems or apparatus.

In another aspect, the disclosure relates to a method of making a material including nanoscale features for use at a selected electromagnetic wavelength range. The material may be a material as described herein for elements or devices used for lithography or other optical applications. The material can also be fabricated using a block copolymer scaffold process. The method may include, for example, fabricating a block copolymer structure having at least a first block and a second block. The method may further include removing the first block, and replacing at least a portion of a volume of the structure occupied by the first block with a metal or semiconductor or polymer, dielectric or monatomic material. The block co-polymer approach can be used to fabricate lithography based materials for use in the UV, EUV, and soft X-ray ranges of wavelengths.

The first block may be, for example, a selectively degradable block. The method may further include removing the second block and/or removing any additional blocks, in whole or in part. The second block and/or any additional blocks may be removed using a process such as plasma etching.

Replacement of at least a portion of the volume may include, for example, electrochemically depositing the metal or semiconductor. Replacement of at least a portion of the volume may include electrodeposition or electroformation of the metal or semiconductor.

In another embodiment, the material can be fabricated using a swiss roll or a laminate process. In the swiss roll process, the material or a subset of the material may be rolled from one end to add a higher dimension to the overall material structure, and a cross section of the overall material appears as multiple formations of the material. For example, but not limited to, a metallo-dielectric 2D array may be rolled from one end to form a 3D cylindrical object where the cross-section of the cylindrical object, perpendicular to the axis, can reveal a stacked structure of multiple units of the original material.

In another aspect, the disclosure relates to an element of a system or subsystem. The element may include a material having nanoscale features designed to be at least partially reflective or transmissive to electromagnetic radiation, or electromagnetic interaction enhancement, in a selected electromagnetic wavelength range. The material may be a material such as described previously or subsequently herein. The material may be disposed on an element, or embedded within the element, or embedded within a radiation emitting system or element within a radiation emitting system, or radiation monitoring device at the selected wavelength range.

Figure 3:
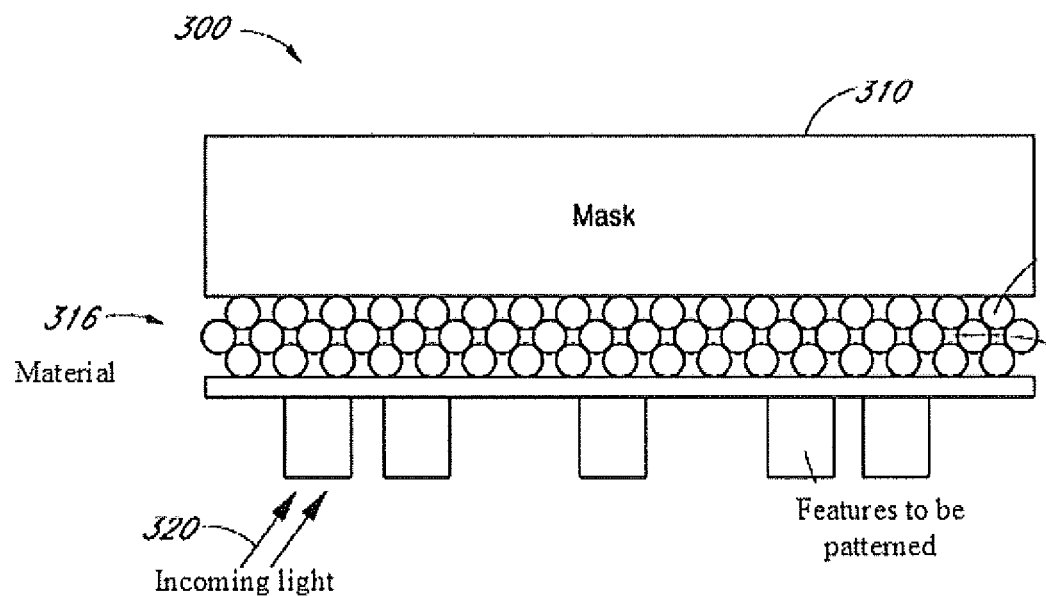
FIG. 3 illustrates an embodiment of a photolithography mask with a material described herein.

In one embodiment, the system or subsystem is a lithography system. The elements may be one of the components of the lithography system. For example, elements can include, but not limited to, a photomask, a detector, a wavelength monitor, bandwidth or power monitor, sensors, photoresist, a substrate, a cooling mechanism, a heat management mechanism, light source, lamp, laser, optical element, mask aligner, integrator, structural component, electrical device, optical device or any other component contained within the system. The system or subsystem may also include a semiconductor manufacturing device or apparatus. FIG. 3 illustrates an element 300 (photomask, in this example) that can include a material 316. The mask 310 can receive radiation 320 of a selected wavelength. In one embodiment, the material 316 can be a 3-D array as described with respect to FIG. 2. In other embodiments, the material 316 can be any of the materials described herein that can increase reflectance of the element 300. In some embodiments, the reflectivity of the element 300 can be increased to more than 70% for a selected wavelength. The wavelength can be between 0.1 nm and 250 nm. The material 316 can be integrated in the mask 310 as illustrated in FIG. 3. In one embodiment, the material is sandwiched between the top and bottom layers of the mask 310. Other methods of affixing the material 316 can also be used.

It should be noted that in addition to lithography systems, the materials described above can also be used in a biotech system, a 2D or 3D printing or patterning system, or a material processing system. These systems can also include elements that can use EUV materials to improve performance. Elements can include, for example, a photomask, a detector, a wavelength monitor, bandwidth or power monitor, sensors, photoresist, a substrate, a cooling mechanism, a heat management mechanism, light source, lamp, laser, optical element, mask aligner, integrator, structural component or any other element or component contained within the system. In some embodiments, the EUV materials can be used in a projection lens system. For example, in this system, instrumentation may include multiple optical elements at the selected wavelength range e.g. a telescope or a satellite.

Another example of a system where EUV materials can be used is a system that involves detection at the selected electromagnetic wavelength range, for example, X-ray detection, imaging and scanning systems, radiation from nucleic particles, and accelerator systems, biotechnology systems. EUV materials can also be used in scanning and imaging systems. EUV materials can also be used in systems that require reduced absorption in one or more ranges of operating wavelengths.

Another example of a system where EUV materials can be used is a system that involves inspection at the selected electromagnetic wavelength range, for example a photomask inspection tool.

In one embodiment, the element is an optical element. The optical element may include an optical substrate, mirror, lens, surface, window, facet, filter, covering element, capping layer, barrier layer, thin film, coating, internal surface area, collector, droplet generator, interdispersed material, panel, waveguide, cavity, fiber, structural component, reflective element, transmissive element, a detector, a camera, a wavelength monitor, bandwidth or power monitor, sensors, electrical device or optical device, or any other optical elements that may be used in systems described above.

The optical substrate can be silicon, fused silica, lithium fluoride, calcium fluoride, or magnesium fluoride.

Figure 5:
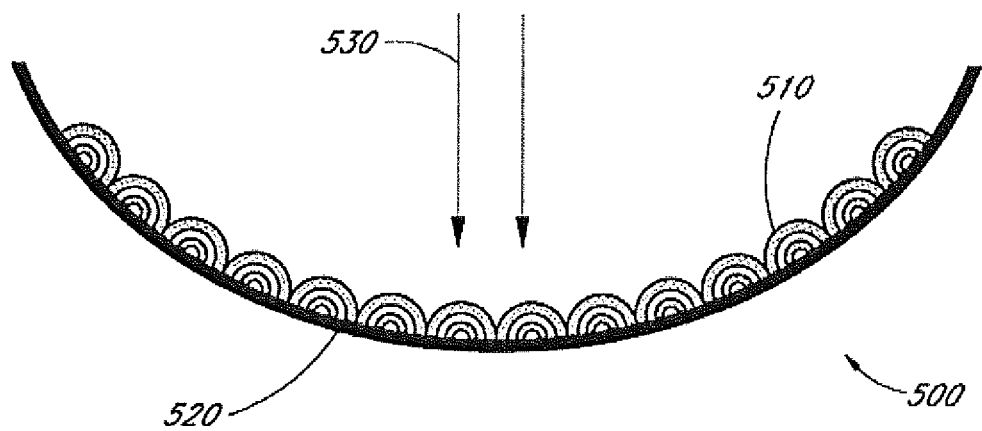
FIG. 5 shows an embodiment of an optical element or surface with a material described herein.

The optical element may also be neither transmissive nor reflective, but serve to increase the electromagnetic interaction with a certain region. For example it may enhance certain electromagnetic mode so radiation, form a cavity, or increase internal surface area available for interaction. FIG. 5 illustrates an embodiment of an optical element 500 where a material 510 is disposed on top of the surface 520 of the optical element 500. The materials can be affixed with the optical element 500 using other methods not shown here.

The optical element 500 can receive radiation 530 of a selected wavelength. In one embodiment, the material 510 can be a 3-D array as described with respect to FIG. 2. In other embodiments, the material 510 can be any of the materials described herein that can increase reflectance of the optical element 500. In some embodiments, the reflectivity of the optical element 500 can be increased to more than 70% for a selected wavelength. The wavelength can be between 0.1 nm and 250 nm. The optical element can be used with any of the systems described herein.

Proper characterization of the EUV material or element is essential to its successful use in a lithographic process, for example. In particular, the nanoscale structures or features necessary for the EUV element to achieve the high reflectivity or transmissive efficiencies must be exposed for measurement, and then the resulting material characterized to assure agreement with the predefined arrangement at that wavelength (perhaps by simulation) and sufficient uniformity across the entire surface area of the EUV material. However, the field of optical engineering has only defined characteristics which have limited meaning and usefulness when characterizing nanoscale structures. Accordingly, a new way of confirming and characterizing an EUV material with nanoscale structures is needed.

A reference EUV material may be used in a characterization set-up. The characterization set-up may measure transmittance, reflectance, absorption, refractive index, scattering, roughness, resistivity, uniformity, bandwidth, angular range, depth of focus, electromagnetic intensity, wavelength sensitivity, amplitude or phase of the material. The characterization set-up may be an ellipsometer, a reflectometer, a spectrophotometer, x-ray diffraction tool (XRD), X-ray photo electron spectroscopy (XPS), scanning electron microscope, (SEM) or (TEM), synchrotron or atomic force microscope (AFM). The characterization set-up may use a lightsource or a laser or table top x ray source, detector, photomask inspection tool, camera, translation or rotational stage, with one or more degrees of freedom. The characterization set-up may make electrical measurements to determine conductance or resistance.

Figure 6B:
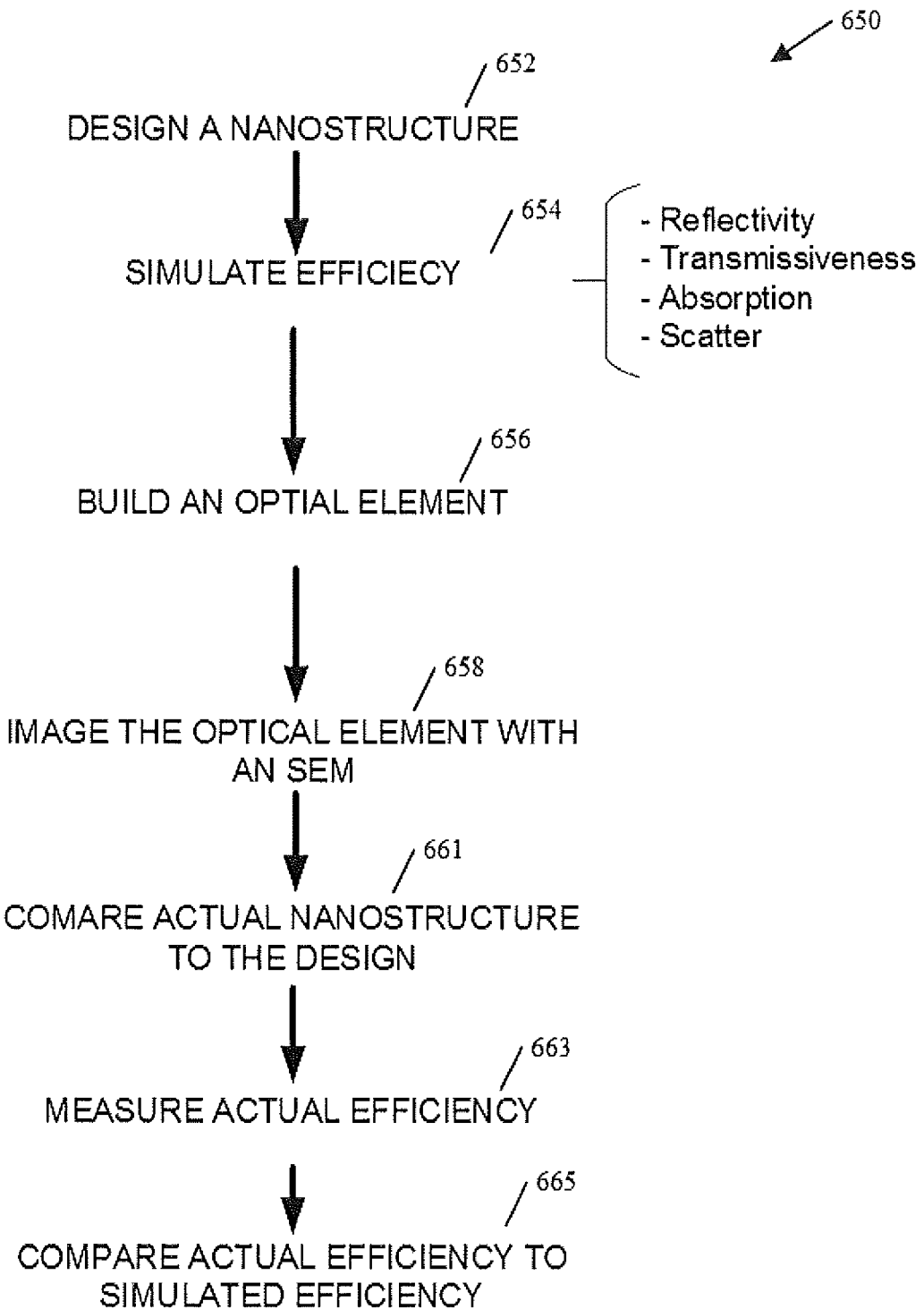
FIG. 6B is a process to characterize an optical element in accordance with the present invention.

The use of characterization has been found to be particularly useful and necessary when done in conjunction with the EUV or optical element having been constructed using a building block assembly or scaffold or hierarchical structure or configuration where sub-structure details in three dimensions and below the top surface are important. In general such configurations are very difficult to build at sub-20 nm lengthscales and visibility using characterization set-ups at this lengthscale is critical to producing new materials. This characterization step helps improve manufacturing yield, accuracy to the simulation and evaluate negative contributions from defects and surface roughness. The use of an atomic force microscope or EUV reflectometer has enabled the surface roughness measurements of the EUV material to be less than 1 nm and has been found to have a highly desirable to observe conformality to the underlying nanostructures. In this way, the use of a scanning electron microscope, atomic force microscope, EUV reflectometer or other such device has been effective in confirming the arrangement of the nanostructure, root mean squared roughness and standard deviation, and its agreement with a pre-defined arrangement (sometimes from simulation). Only then can the overall material configuration expect to achieve the advanced optical properties. More generally, as illustrated in the characterization process 650 of FIG. 6B, an optical physicist will design a target pattern of nano structures 652 for the EUV material, and simulate 654 the theoretical efficiencies. These structures are built up 656 using an assembly and or deposition process as described earlier, which allow highly conformal low surface roughness materials to be interspersed in the configuration. Once the EUV material has been created, a scanning electron microscope may be used to image 658 the actual nanostructures, and thereby an understanding of the overall nanostructure pattern of the entire material configuration may be exposed. After imaging the entire configuration is measured 663 perhaps using a reflectometer or EUV lightsource to confirm the optical performance and efficiency or transmission or reflectivity according to the pre-defined arrangement. Scanning electron microscope to measure and characterize the quality of the nanostructure patterns and arrangements. The actual characterization information is compared 661, 665 to the simulated characteristics and structure, which may then be used to modify the manufacturing process to improve the placement of the nanostructural features, or to improve surface roughness, or to confirm that particular EUV material is compliant with specifications so that it will have the desired reflectivity characteristics at the target EUV wavelength.

Figure 4:
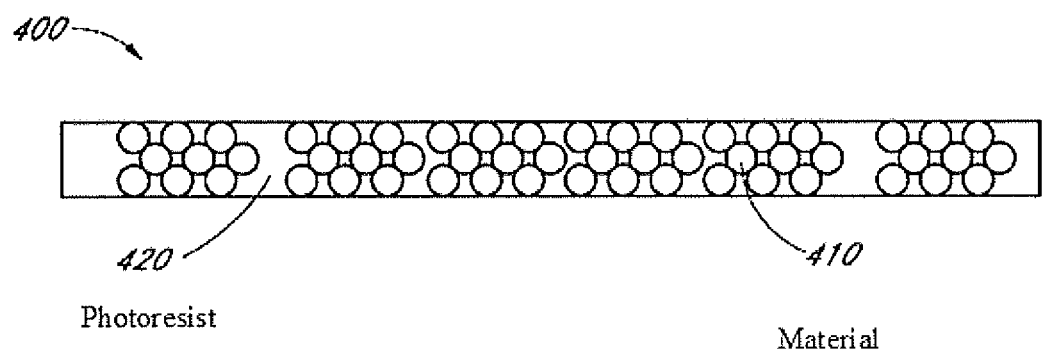
FIG. 4 shows and embodiment of photoresist with material described herein.

FIG. 4 illustrates an embodiment of a material-photoresist composite 400. The material 410 can be embedded or interdispersed in a host material, e.g. photoresist 420. The material can improve the performance of the host material 420. In the case of photoresist, the increase in electromagnetic interaction i.e. scattering and absorption with the polymer or organic material can increase the sensitivity of the photoresist.

In another aspect, the disclosure relates to a reflective element. The reflective element may include a material having nanoscale features configured to be at least partially reflective to electromagnetic radiation in a selected electromagnetic wavelength range. The material may be a material such as described previously or subsequently herein.

The reflective element may be, for example, an optic or a component of an optic. The optic may be, for example, a mirror, lens, optical window, filter or coating, thin film, membrane or substrate or other optical element. Alternately, the reflective element may be a component of a mask or a coating or layer of material of the mask. The mask may be a photolithography mask. Alternately, the reflective element may be a photoresist or an element of a photoresist. The photoresist may be a photolithography photoresist. The reflective element may be, for example, a component or element of a lithography device or system, such as an EUVL system, or a soft X-ray system.

The reflective element may be, for example, a coating or layer of material disposed on or in an optic, photoresist, mask, or other component or device. The optic may be a fused silica or calcium fluoride optic.

The reflective element may be, for example, configured as a component of a photolithography device. The reflective element may be configured as a component of an electromagnetic radiation source device. The reflective element may be configured as a component of a semiconductor manufacturing device or other device using UV, EUV, or soft X-ray electromagnetic radiation. The reflective element may be a component of a UV, EUV, or X-ray lightsource.

The reflective element may include a material having nanoscale features configured to be partially reflective in the selected electromagnetic wavelength range. Alternately, or in addition, the reflective element may include material having nanoscale features configured to be substantially fully reflective in the selected electromagnetic wavelength range. In some embodiments, the reflective element may include material having structural features configured to have a reflectivity of greater than or equal to 70%.

The reflective element may include a material having nanoscale features configured to be reflective in the selected electromagnetic wavelength range where the material can be consistently fabricated to have a reflectivity greater than or equal to 70%.

The reflective element may include a material having nanoscale features configured to increase spectral bandwidth in the electromagnetic wavelength range. An example of this would be a graded structure.

The reflective element may include a material having nanoscale features configured to increase angular acceptance in the electromagnetic wavelength range. An example of this would be a 2D or 3D symmetric structure.

The reflective element may include a material having nanoscale features configured to increase average reflectance (integrated or averaged over the spectral range) in the electromagnetic wavelength range.

In another aspect, the disclosure relates to a transmissive/transparent element. The transparent element may include a material having nanoscale features configured to be at least partially transmissive (greater than or equal to 4%) to electromagnetic radiation in a selected electromagnetic wavelength range. The material may be a material such as described previously or subsequently herein. The transparent element may be, for example, a component or element of a lithography device or system, such as an EUVL system, or a soft X-ray system or a biotechnology or material processing system.

The transparent element may be, for example, an optic or a component of an optic. The optic may be, for example, a mirror, lens, optical window, or other optical element. Alternately, the transparent element may be a component of a mask or a coating or layer of material of the mask. The mask may be a photolithography mask. Alternately, the transparent element may be a photoresist or an element of a photoresist. The photoresist may be a photolithography photoresist.

The transparent element may be, for example, a coating or layer of material disposed on or in an optic, photoresist, mask, or other component or device. The optic may be a fused silica or calcium fluoride optic.

The transparent element may be a component of a photolithography device. In some embodiments, the transparent element can be a component of an electromagnetic radiation source device. The transparent element may also be configured as a component of a semiconductor manufacturing device or other device using UV, EUV, or soft Xray electromagnetic radiation. The transparent element may be a component of a UV, EUV, or X-ray light source. The transparent element may be a component of an optical window or a coating or layer of material disposed on or in the optical window.

In another embodiment the material may be used in a collection of optics, as part of an optical system. The system could be a stepper, or step and scan system, or have the potential for image reduction. The material may help to improve the overall system efficiency, electrical efficiency or optical efficiency of the system. The material may also reduce the overall electricity consumption of the tool.

In another embodiment the material may be used in space, above ground, extra-terrestrial, ground based, satellite, aerial and surveillance based applications, or as part of a system or sub-system in these applications. The material may be used in solar imaging, or X-ray imaging.

The material may also be used in a machining tool or material processing tool or cutting or dicing tool. The tool may be a high throughput tool which processes a high volume of samples per day or a high speed tool, used for example in inspection, data analysis, or imaging.

The material may be used to engineer an electromagnetic wavefront. This may include controlling amplitude, phase, coherence, angular range, or localized refractive index of the electromagnetic wavefront, both on a wavelength or sub wavelength scale.

The material may be used in a spectral purity filter where one or electromagnetic wavelength or range of wavelengths is transmitted and one or more wavelength is reflected or absorbed.

The material may also be used as an ion debris filter or a pellicule. Also, sometimes in a plasma source, or a photomask system.

The material may be used in a system used to separate, write, edit, transfer, heat, cut or illuminate a biological sample. For example, the material may be used in an EUV lightsource and system, and used to selectively splice a strand of DNA or cut a cell, or a genetic sequence.

In another embodiment the EUV material may be used in a light exposure system in electronics manufacturing in combination with a directed self assembly manufacture system (DSA). In this case electronics are manufactured on a wafer using either or both a lithography system and a directed self assembly manufacturing method.

In another aspect, the disclosure relates to means for fabricating and using the above-described nanophotonics materials and related methods, in whole or in part.

In another aspect, the disclosure relates to methods of using such nanophotonics materials in systems such as extreme ultraviolet lithography (EUVL) or soft Xray lithography systems or other systems.

In another aspect, the disclosure relates to components, devices, and systems including the above-described nanophotonics materials, in whole or in part.

The nanophotonics material may include a periodic one, two or three-dimensional structure engineered to have a low bulk absorption of electromagnetic radiation at selected wavelengths, such as at UV, EUV, or soft X-ray wavelengths.

Various additional aspects, features, and functionality are further described below in conjunction with the appended Drawings.

[The exemplary embodiments described herein are provided for the purpose of illustrating examples of various aspects, details, and functions of apparatus, methods, and systems for inspecting the interior if pipes, conduits, and other voids; however, the described embodiments are not intended to be in any way limiting. It will be apparent to one of ordinary skill in the art that various aspects may be implemented in other embodiments within the spirit and scope of the present disclosure.

It is noted that as used herein, the term, "exemplary" means "serving as an example, instance, or illustration." Any aspect, detail, function, implementation, and/or embodiment described herein as "exemplary" is not necessarily to be construed as preferred or advantageous over other aspects and/or embodiments.

Extreme Ultraviolet Lithography is a significant departure from other ultraviolet (UV) lithography, such as the deep ultraviolet lithography technology in general use today. EUV radiation is highly absorbed by all materials, and therefore EUV lithography typically takes place in a vacuum. Optical elements in such systems should be configured to minimize absorption of EUV radiation, however, this is difficult to implement. For example, components such as mirrors will typically absorb around 35-40% of the incident light.

Typical pre-production EUVL systems built to date contain at least two condenser multilayer mirrors, six projection multilayer mirrors, and a multilayer object (mask). Since the optics already absorbs approximately 96% of the available EUV light, an appropriate EUV lightsource will need to be sufficiently bright to overcome this loss of radiation. EUV source development has focused on plasmas generated by laser or discharge pulses. The mirror responsible for collecting the light is directly exposed to the plasma and is therefore vulnerable to thermal damage and damage from the high-energy ions and other debris. This damage associated with the high-energy process of generating EUV radiation has limited implementation of EUV light sources for lithography.

Consequently, existing EUV Lithography scanner units have poor efficiency because of these absorption properties of EUV lithography devices using traditional materials for elements such as optics, mirrors, optical windows, masks, photoresists, and other elements or components.

While one-dimensional structures may present some potential advantages, they also include limitations. For example, initial simulation analysis of a molybdenum/silicon multilayer stack configuration indicates that the maximum reflectivity obtainable from a one dimensional molybdenum/silicon multilayer stack at 90 nanometers with 50 layers of periodicity is a theoretical maximum of 70.6% at zero degrees incident angle, as shown in FIG. 1. In practice the reflectivity is lower due to defects in fabrication process and Mie Scattering.

Accordingly, in some embodiments, an EUV reflective element (and associated devices) having a two or three dimensional nanoscale structure, for operating in wavelength ranges of approximately 13.5 nm and having a reflectivity of approximately 80 percent or higher, may be fabricated and used in applications such as EUVL, using techniques such as those described here. In addition, materials with similarly transmissive properties (e.g., EUV transparent materials and associate components and devices) may be similarly fabricated using techniques such as those described herein.

In another aspect, nanostructured two or three dimensional materials such as those described herein or similar or equivalent materials may be used in components & devices such as, for example, lasers and laser systems, light sources, scanners, masks, and resist materials, or other devices or systems for use in manufacturing semiconductors or other devices.

Other applications may include plasma sources or synchrotron radiation sources or other electromagnetic radiation sources. Still other applications may include excimer or other lasers, such as industrial lasers, as well as X-ray electromagnetic radiation devices or other devices for generating or using electromagnetic radiation in wavelength ranges such as infrared, visual, UV, EUV, or Xray wavelengths. Components and devices using nanophotonic materials may also be used in other applications such as biomedical devices or other devices or systems.

In some embodiments, a three dimensional graphene photonic crystal may be used as a nanophotonics material for devices and systems operating at UV, EUV and Xray wavelengths. Graphene is a recently developed material that has high thermal conductivity and can be configured to be transparent or, through use of stacking, layering or other composite configurations, made reflective or absorptive. Similarly, in some embodiments, carbon nanotubes, which have similar properties to graphene, may be used to make transparent or reflective nanophotonics materials. For example, graphene or carbon nanotube materials may be used in lithography devices as, for example, a coating or layered material. High thermal conductivity of these materials makes them advantageous for applications where transparency or reflectivity are required (e.g., at UV, EUV, and/or soft Xray wavelengths) along with a need for high conduction generated heat (e.g., high thermal dissipation in devices such as light scanning tools, machines for wafer patterning, multi-photon devices, or other devices or systems where UV, EUV, and/or Xray radiation is used, such as to pattern a photoresist.

In another embodiment, a nanostructured material may be fabricated in a double gyroid structure. The double gyroid structure may comprise, for example, Gold (Au) and/or Molybdenum (Mo). The double gyroid structure may be fabricated using a block copolymer technique, such as described previously herein. Such a material may have a low metallic density with ambient air in the interstices. For example, the metallic density may be less than corresponding bulk material by, for example, a factor of 10 or greater.

Other embodiments and modifications of this disclosure may occur readily to those of ordinary skill in the art in view of these teachings. Therefore, the protection afforded this disclosure is to be limited only by the following claims, which include all such embodiments and modifications when viewed in conjunction with the above specification and accompanying drawing.

It is understood that the specific order or hierarchy of steps or stages in the processes and methods disclosed herein are examples of exemplary approaches. Based upon design preferences, it is understood that the specific order or hierarchy of steps in the processes may be rearranged while remaining within the scope of the present disclosure unless noted otherwise.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

The disclosure is not intended to be limited to the aspects shown herein, but is to be accorded the full scope consistent with the specification and drawings, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c.

The previous description of the disclosed aspects is provided to enable any person skilled in the art to make or use the present disclosure. Various modifications to these aspects will be readily apparent to those skilled in the art, and the generic principles defined herein may be applied to other aspects without departing from the spirit or scope of the disclosure. Thus, the disclosure is not intended to be limited to the aspects shown herein but is to be accorded the widest scope consistent with the principles and novel features disclosed herein.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. In addition, the articles "a" and "an" are to be construed to mean "one or more" or "at least one" unless specified otherwise.

Conjunctive language such as the phrase "at least one of X, Y and Z," unless specifically stated otherwise, is otherwise understood with the context as used in general to convey that an item, term, etc. may be either X, Y or Z. Thus, such conjunctive language is not generally intended to imply that certain embodiments require at least one of X, at least one of Y and at least one of Z to each be present.

While the above detailed description has shown, described, and pointed out novel features as applied to various embodiments, it will be understood that various omissions, substitutions, and changes in the form and details of the devices or algorithms illustrated can be made without departing from the spirit of the disclosure. Thus, nothing in the foregoing description is intended to imply that any particular feature, characteristic, step, module, or block is necessary or indispensable. As will be recognized, the processes described herein can be embodied within a form that does not provide all of the features and benefits set forth herein, as some features can be used or practiced separately from others. The scope of protection is defined by the appended claims rather than by the foregoing description.

What is claimed is:

1. A method of manufacturing an optical element, the element intended to be reflective or transmissive at a target wavelength in a range from 0.1 to 249 nanometer, comprising:
    providing a substrate or membrane that physically supports a coating that either reflects or transmits at the target wavelength, and wherein a protective layer may be above the coating;
    the coating comprising:
        a set of nanoscale building blocks assembled directly above the substrate or membrane into a configuration or scaffold structure having a predefined arrangement;
        depositing, using atomic layer deposition, a material into the configuration or scaffold; and
        the building blocks' size tuned to produce a reflection or transmission electromagnetic resonance at the target wavelength.

2. The method according to claim 1, where the element is intended to increase or decrease absorption beyond its bulk counterpart at the target wavelength.

3. The method according to claim 1, further including the step of using a Ruthenium, Niobium or Molybdenum precursor, or an organic precursor in the atomic layer deposition.

4. The method according to claim 1, wherein the configuration is periodic in one, two or three dimensions.

5. The method according to claim 1 where the configuration includes shapes or dimensions containing layers, films, spheres, blocks, pyramids, rings, porous structures, cylinders, linked shapes, shells, freeform shapes, gyroids, chiral structures, hemispheres or segments.

6. The method according to claim 5 where the building blocks are made from polymer, metal, semiconductor, dielectric, gases, compound, carbon, monolayer materials, graphene, organic materials, metal organic materials.

7. The method according to claim 1, wherein the scaffold structure is sacrificial, and upon removal, voids within the material form at least part of the assembled configuration.

8. The method according to claim 1, wherein the material is deposited with a surface roughness of less than 1 nm, and has sufficient conformality that the topology of the deposited material is highly indicative of the nanoscale building blocks.

9. The method according to claim 1, further including the step of imaging, using a scanning electron microscope or atomic force microscope, the nanoscale building blocks.

10. The method according to claim 9, further including the step of comparing the imaged nanoscale building blocks to the pre-defined arrangement.

11. The method according to claim 1, wherein the target wavelength is less than about 120 nm.

12. The method according to claim 1, wherein the target wavelength is less than about 20 nm.

13. An optical element, the element intended to be reflective at a target wavelength in a range from 0.1 to 249 nanometer, comprising:
    a substrate that physically supports a coating that either reflects or transmits at the target wavelength, and wherein a protective layer may be above the coating;
    the coating comprising:
        a set of nanoscale building blocks assembled directly above the substrate into a configuration or scaffold structure having a predefined arrangement;
        a material deposited, using atomic layer deposition, into the configuration or scaffold; and
        the building blocks' size tuned to produce a reflection or transmission electromagnetic resonance at the target wavelength.

14. The optical element according to claim 13 where the building blocks are made from polymer, metal, semiconductor, dielectric, gases, compound, carbon, monolayer materials, graphene, organic materials, metal organic materials.

15. The optical element according to claim 13, wherein the scaffold structure is sacrificial, and upon removal, voids within the material form at least part of the assembled configuration.

16. The optical element according to claim 13, wherein the material is deposited with a surface roughness of less than 1 nm, and has sufficient conformality that the topology of the deposited material is highly indicative of the nanoscale building blocks.

17. The optical according to claim 13, where the element is intended to increase or decrease absorption beyond its bulk counterpart at the target wavelength.

18. The optical according to claim 13, wherein the configuration is periodic in one, two or three dimensions.

19. The optical according to claim 13 wherein the configuration includes shapes or dimensions containing layers, films, spheres, blocks, pyramids, rings, porous structures, cylinders, linked shapes, shells, freeform shapes, gyroids, chiral structures, hemispheres or segments.

20. The optical according to claim 13, wherein the target wavelength is less than about 120 nm.

21. The optical according to claim 13, wherein the target wavelength is less than about 20 nm.

22. A method of manufacturing an optical element, the element intended to interact with a target wavelength in a range from 0.1 to 249 nanometer, comprising:
- providing a substrate or membrane that physically supports a coating that either reflects or transmits at the target wavelength, and wherein a protective layer may be above the coating;
- the coating comprising:
- a set of sub-wavelength nanoscale building blocks assembled into a configuration or scaffold structure having a predefined arrangement, the plurality of nanoscale building blocks having a size that is less than the target wavelength; and
- depositing, using atomic layer deposition, a material into the configuration or scaffold; and
- the building blocks' size tuned to produce a reflection or transmission electromagnetic resonance at the target wavelength.

23. The method according to claim 22, wherein the electromagnetic resonance causes reflection at the target wavelength.

24. The method according to claim 22, wherein the electromagnetic resonance causes transmission at the target wavelength.

25. The method according to claim 22, wherein the electromagnetic resonance causes an increase or decrease in absorption beyond its bulk counterpart at the target wavelength.

26. A method of manufacturing an optical element, the element intended to interact with a target wavelength in a range from 0.1 to 249 nanometer, comprising:
- providing a coating that either reflects or transmits at the target wavelength, and wherein a protective layer may be above the coating;
- the coating comprising:
- a set of nanoscale building blocks assembled into a configuration or scaffold structure having a predefined arrangement, the plurality of nanoscale building blocks having a size that is less than 100 nm;
- depositing, using atomic layer deposition, a material into the configuration or scaffold; and
- the building blocks' size tuned to produce a reflection or transmission electromagnetic resonance at the target wavelength.

* * * * *